United States Patent
Masai

(10) Patent No.: US 10,199,292 B2
(45) Date of Patent: Feb. 5, 2019

(54) SEMICONDUCTOR DEVICE, SEMICONDUCTOR CHIP, AND TEST METHOD FOR SEMICONDUCTOR CHIP

(71) Applicant: LAPIS Semiconductor Co., Ltd., Yokohama (JP)

(72) Inventor: Hideki Masai, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 38 days.

(21) Appl. No.: 15/497,713

(22) Filed: Apr. 26, 2017

(65) Prior Publication Data
US 2017/0316990 A1    Nov. 2, 2017

(30) Foreign Application Priority Data

Apr. 28, 2016 (JP) ................................ 2016-090323

(51) Int. Cl.
| | |
|---|---|
| *H01L 23/525* | (2006.01) |
| *H01L 21/66* | (2006.01) |
| *G01R 31/26* | (2014.01) |
| *H01L 23/522* | (2006.01) |
| *H01L 23/00* | (2006.01) |

(52) U.S. Cl.
CPC .......... *H01L 22/32* (2013.01); *G01R 31/2644* (2013.01); *H01L 22/14* (2013.01); *H01L 23/525* (2013.01); *H01L 23/5228* (2013.01); *H01L 24/48* (2013.01); *H01L 2224/48132* (2013.01); *H01L 2924/181* (2013.01)

(58) Field of Classification Search
CPC ....... H01L 22/32; H01L 23/525; H01L 24/28; H01L 23/5228; H01L 22/14; H01L 2224/48132; G01R 31/2644
See application file for complete search history.

(56) References Cited

U.S. PATENT DOCUMENTS

2006/0256052 A1* 11/2006 Udo ........................ G09G 3/006
                                                                                345/87
2017/0025081 A1*  1/2017 Satoh ................... G09G 3/3696

FOREIGN PATENT DOCUMENTS

JP          2003-163246 A     6/2003

* cited by examiner

*Primary Examiner* — A. Sefer
(74) *Attorney, Agent, or Firm* — Rabin & Berdo, P.C.

(57) ABSTRACT

A semiconductor device includes a signal processing circuit configured to generate an output signal, an output pad, an output line connecting the signal processing circuit to the output pad, the output signal from the signal processing circuit being output from the output pad through the output line, a shorting pad formed in the output line, a switch connected between the shorting pad and the output pad, and configured to connect the signal processing circuit to the output pad when the switch is on, and disconnect the signal processing circuit from the output pad when the switch is off, and a wiring line connecting the shorting pad to the output pad.

14 Claims, 15 Drawing Sheets

SEMICONDUCTOR DEVICE, SEMICONDUCTOR CHIP, AND TEST METHOD FOR SEMICONDUCTOR CHIP

BACKGROUND OF THE INVENTION

Background Arts

The present invention relates to a semiconductor device, and in particular, a semiconductor device including a test circuit, a semiconductor chip, and a test method for a semiconductor chip.

Background Arts

Prior to shipping, semiconductor devices are tested in order to confirm whether or not a desired output signal is outputted from an output terminal when a prescribed signal is applied to an input terminal. When performing the test, a probe needle is placed in contact with a pad that is connected to each output terminal of the semiconductor device, and the output signal is acquired through the probe needle, for example.

In the case of semiconductor devices with a large number of output terminals such as driver ICs for display panels, in order to mitigate an increase in IC chip area resulting from the increase in the number of output terminals, it is desirable for the space between adjacent pads to be narrowed.

In such a case, when the space between adjacent pads is narrowed, it becomes difficult to cause the probe needle to contact each pad in a manner such that the probe needles do not interfere with each other. In order to solve this problem, a semiconductor device was proposed in which a switching circuit for extracting in an alternating fashion the signals of the pads connected to the respective output terminals, and a test pad were further provided, and each signal selected by the switching circuit was outputted from the test pad (see, for example, Japanese Patent Application Laid-Open Publication No. 2003-163246). According to this configuration, during testing, the probe needle need only be in contact with the test pad of the semiconductor device, and thus, it is possible for the probe needle to be reliably connected to the test pad even if the space between the pads is narrow.

SUMMARY OF THE INVENTION

However, there was a problem that in the above-mentioned semiconductor device, test pads having a surface area sufficient for the probe needle to come into contact therewith needed to be further provided for testing, and as a result, the area that could be taken up by circuitry for primary functions was proportionally reduced.

Also, the semiconductor device was provided with a switch element, as the switching circuit, that disconnects the output buffer from the output pad only when performing testing. Thus, during normal use, the signal outputted from the output buffer was outputted outside from the output pad through the switch element.

Thus, there was a problem that in order to attain desired through rate characteristics for the output buffer, a transistor with low on resistance would need to be used for the switch element, and such a transistor would have a larger surface area, resulting in an increase in size of the semiconductor device.

An object of the present invention is to provide a semiconductor device, a semiconductor chip, and a test method for a semiconductor chip by which it is possible to perform pre-shipping tests without a degradation in output characteristics or an increase in size of the device.

According to one aspect of the invention, a semiconductor device includes a signal processing circuit configured to generate an output signal, an output pad, an output line connecting the signal processing circuit to the output pad, the output signal from the signal processing circuit being output from the output pad through the output line, a shorting pad formed in the output line, a switch connected between the shorting pad and the output pad, and configured to connect the signal processing circuit to the output pad when the switch is on, and disconnect the signal processing circuit from the output pad when the switch is off, and a wiring line connecting the shorting pad to the output pad.

According to one aspect of the invention, a semiconductor chip having a test mode and a normal mode includes a signal processing circuit configured to generate first to nth output signals, n being an integer of 2 or greater, first to nth output pads, first to nth output lines respectively connecting the signal processing circuit to the first to nth output pads, the first to nth output signals from the signal processing circuit respectively being output from the first to nth output pads through the first to nth output lines in the normal mode, a shorting pad formed in the first output line, a common output line, one end of the common output line being connected to the first output line, first to nth switches, the first switch being connected between the shorting pad and the common output line, each of the second to nth switches respectively being connected between a corresponding one of the second to nth output lines and the common output line, and being configured to connect the signal processing circuit to the common output line and disconnect the signal processing circuit from the common output line according to when said each switch is turned on and off, respectively, and a testing control unit configured to receive a test signal indicating either the test mode or the normal mode, when the test signal indicates the test mode, to control the first to nth switches selectively and alternately to be turned on, and when the test signal indicates the normal mode, to control all of the first to nth switches to be turned off.

According to one aspect of the invention, a semiconductor chip includes a signal processing circuit configured to generate an output signal, an output pad, an output line connecting the signal processing circuit to the output pad, the output signal from the signal processing circuit being output from the output pad through the output line, a shorting pad formed in the output line, the shorting pad and the output pad being formed in a same bump area; and a switch connected between the shorting pad and the output pad, and configured to connect the signal processing circuit to the output pad when the switch is on, and disconnect the signal processing circuit from the output pad when the switch is off.

According to one aspect of the invention, a test method for a semiconductor chip, the semiconductor chip having a test mode and a normal mode, and including a signal processing circuit configured to generate first to nth output signals, n being an integer of 2 or greater, first to nth output pads, first to nth output lines respectively connecting the signal processing circuit to the first to nth output pads, the first to nth output signals from the signal processing circuit respectively being output from the first to nth output pads through the first to nth output lines in the normal mode, a shorting pad formed in the first output line, a common output line, one end being connected to the first output line, first to nth switches, the first switch being connected between the shorting pad and the common output line, each of the second to nth switches respectively being connected between a corresponding one of the second to nth output lines and the common output line, and being configured to connect the signal processing circuit to the common output line or disconnect the signal processing circuit from the common output line according to according to when said each switch is turned on and off, respectively, and a testing control unit configured to control the first to nth switches upon receiving a test signal indicating either the test mode or the normal mode. The method includes sequentially and alternately turning on the first to nth switches in the test mode, thereby acquiring the first to nth output signals from the first output pad by time division, respectively, and turning off all of the first to nth switches in the normal mode, thereby to output the first to nth output signals respectively from the first to nth output pads in the normal mode.

According to the present invention, it is possible to perform testing of the semiconductor chip using existing output pads, without the need for test pads for contact with the probe needle. Furthermore, in the semiconductor device including the semiconductor chip, an output signal generated in an internal signal processing circuit is supplied to the output pad without passing through a switch element for testing.

Thus, according to the present invention, it is possible to perform pre-shipping tests without a degradation in output characteristics or an increase in size of the device.

DETAILED DESCRIPTION FOR THE INVENTION

Embodiments of the present invention will be explained in detail below with reference to the drawings.

Embodiment 1

Figure 1:
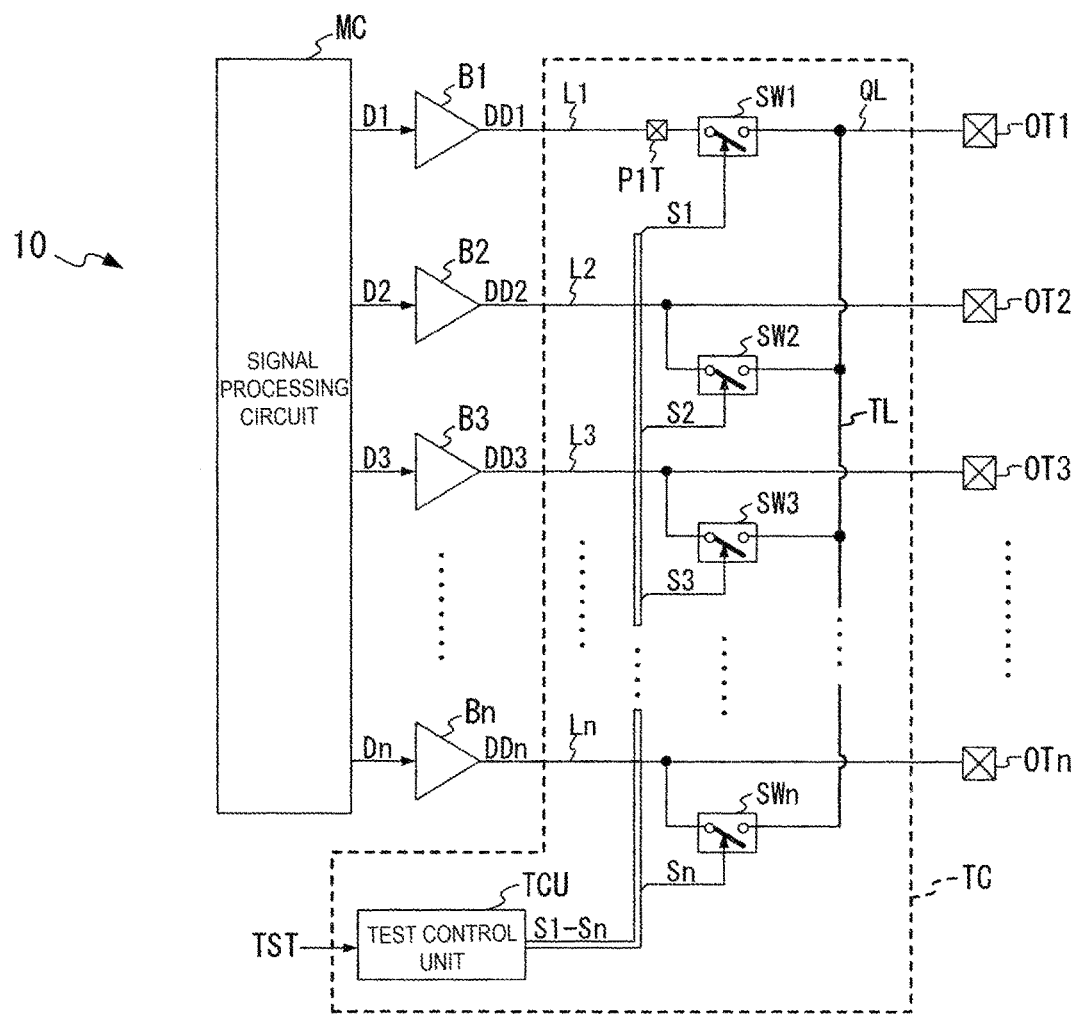
FIG. 1 is a circuit diagram showing an example of a circuit formed in a semiconductor chip 10 after manufacturing.

FIG. 1 is a circuit diagram showing an example of a circuit formed in a semiconductor chip 10 after manufacturing. As shown in FIG. 1, the semiconductor chip 10 has formed therein a signal processing circuit MC, output buffers B1 to Bn (n being an integer of 2 or greater), a testing circuit TC, and output pads OT1 to OTn.

The signal processing circuit MC is configured to supply to the output buffers B1 to Bn data signals D1 to Dn generated by performing a signal process (explanation omitted) required for the semiconductor chip 10.

The output buffers B1 to Bn are configured to supply, to the testing circuit TC through lines L1 to Ln, output data signals DD1 to DDn generated by individually amplifying the data signals D1 to Dn by a gain of 1, for example. Among the lines L1 to Ln, the lines L2 to Ln are individually connected to the output pads OT2 to OTn of the semiconductor chip 10.

The testing circuit TC has switch elements SW1 to SWn provided for each of the buffers B1 to Bn, a shorting pad P1T, an output line QL, a common output line TL, and a testing control unit TCU.

In the testing circuit TC, one end of the switch element SW1 is connected to the line L1, and one end of the switch element SW2 is connected to the line L2. Similarly, one end of each switch element SW(k) (k being an integer of 3 to n) is connected to a line L(k).

The other end of the switch element SW1 is connected to the output pad OT1 through the output line QL.

The line L1 has formed thereon the shorting pad P1T for connecting to a wiring line for shorting.

The other end of each of the switch elements SW2 to SWn is connected to the common output line TL. One end of the common output line TL is connected to the output line QL.

The testing control unit TCU is configured to receive a test signal TST representing either a test mode or a normal mode, and to generate switching signal S1 to Sn to individually designate the state (on or off) of each switch element SW1 to SWn according to the test signal TST.

In other words, if the test signal TST has a logic level of 0, for example, representing normal mode, then the testing control unit TCU generates switching signals S1 to Sn that set all switch elements SW1 to SWn off. On the other hand, if the test signal TST switches from a logic level of 0 to a logic level of 1, for example, representing test mode, then the testing control unit TCU generates switching signals S1 to Sn that sequentially and alternately set all switch elements SW1 to SWn on.

The testing control unit TCU supplies the generated switching signals S1 to Sn to the control terminals of the corresponding switch elements SW1 to SWn.

The switch element SW1 turns on according to the switching signal S1 indicating an on state and connects the line L1 to the output line QL. In this manner, the output data signal DD1 supplied through the line L1 from the output buffer B1 is supplied to the output pad OT1 through the switch element SW1 and the output line QL. On the other hand, the switch element SW1 turns off according to the switching signal S1 indicating an off state and disconnects the line L1 from the output line QL.

The switch element SW2 turns on according to the switching signal S2 indicating an on state and connects the line L2 to the common output line TL. In this manner, the output data signal DD2 supplied through the line L2 from the output buffer B2 is supplied to the output pad OT1 through the switch element SW2, the common output line TL, and the output line QL. On the other hand, the switch element SW2 turns off according to the switching signal S2 indicating an off state and disconnects the line L2 from the common output line TL.

Similarly, the switch element SW(k) (k being an integer of 3 to n) is turned on when the switching signal S(k) indicates an on state, and connects the line L(k) to the common output line TL. In this manner, the output data signal DD(k) supplied through the line L(k) from the output buffer B(k) is supplied to the output pad OT1 through the switch element SW(k), the common output line TL, and the output line QL. On the other hand, if the switching signal S(k) indicates an off state, the switch element SW(k) turns off and disconnects the line L(k) from the common output line TL.

Figure 2:
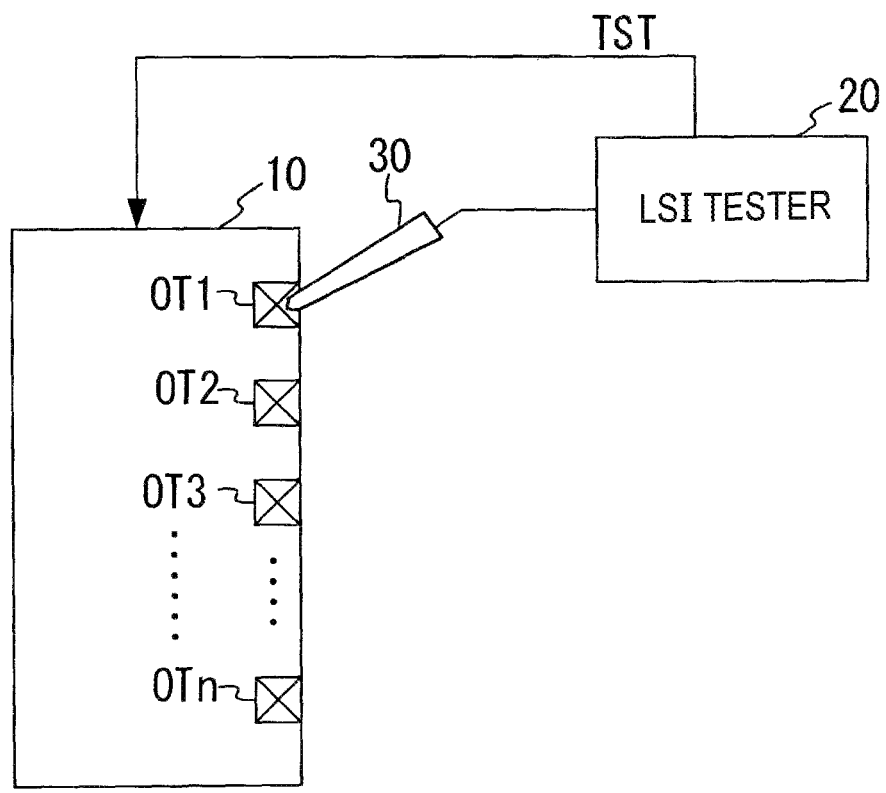
FIG. 2 is a block diagram showing a system configuration for testing the semiconductor chip 10 prior to shipping.

FIG. 2 is a block diagram showing a system configuration for testing the semiconductor chip 10 prior to shipping. When performing the test, first, as shown in FIG. 2, a probe needle 30 of an LSI tester 20 is caused to contact only the output pad OT1 among the output pads OT1 to OTn of the semiconductor chip 10 to be tested. Here, the LSI tester 20 is configured to supply the test signal TST to the semiconductor chip 10.

Figure 3:
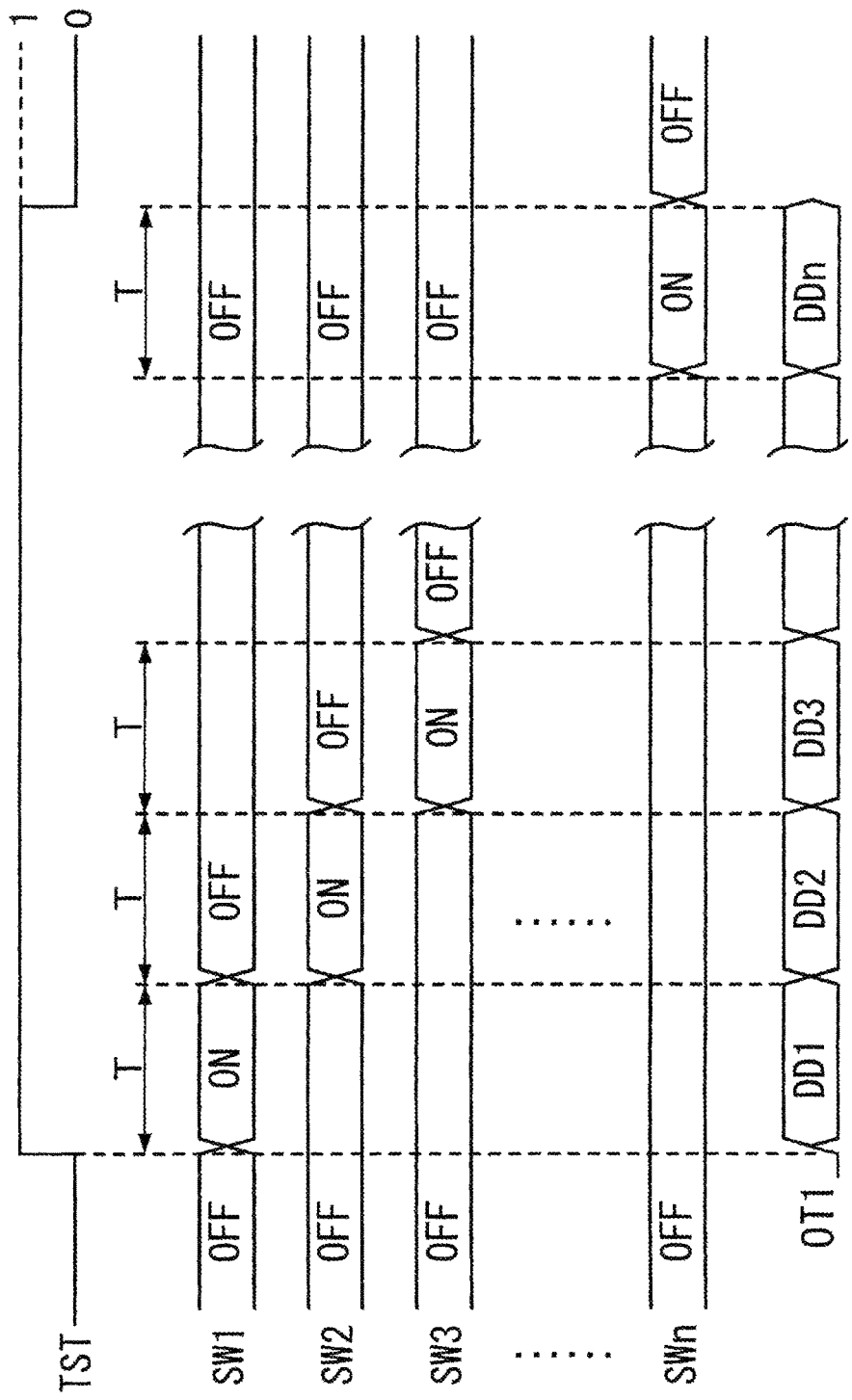
FIG. 3 is a time chart showing an example of operations performed in a testing circuit TC of the semiconductor chip 10 shown in FIG. 1 according to a test signal TST.

FIG. 3 is a time chart showing an example of operations performed in a testing circuit TC of the semiconductor chip 10 according to a test signal TST. In FIG. 2, first, the LSI tester 20 supplies a test signal TST with a logic level of 0 indicating normal mode to the semiconductor chip 10. At the time of shipping, the level of the test signal TST is fixed at ground potential, for example, such that the test signal TST supplied to the semiconductor chip 10 is always at the logic level of 0 indicating normal mode.

While the test signal TST remains at a logic level of 0, testing control unit TCU supplies to the switch elements SW1 to SWn the switching signals S1 to Sn to set all the switch elements SW1 to SWn off. Thus, during this period, the switch elements SW1 to SWn are all off, and therefore, the output pad OT1 is not connected to any of the output buffers B1 to Bn. Thus, the LSI tester 20 determines that no signal has been acquired from the probe needle 30.

Then, the LSI tester 20 switches the test signal TST from a logic level of 0 to the logic level of 1 indicating test mode. When the test signal TST switches from a logic level of 0 to a logic level of 1, then as shown in FIG. 3, for example, the testing control unit TCU supplies to the control terminal of the switch elements SW1 to SWn the switching signals S1 to Sn that sequentially and alternately set the switch elements on for a prescribed period T in the order of the switch elements SW1, SW2, SW3, . . . and SWn.

In this manner, first, only the switch element SW1 among the switch elements SW1 to SWn turns on and the rest of the switch elements are all off, and thus, the output data signal DD1 outputted by the output buffer B1 is outputted from the output pad OT1 as shown in FIG. 3 through the output line QL.

Next, only the switch element SW2 among the switch elements SW1 to SWn turns on and the rest of the switch elements are all off, and thus, the output data signal DD2 outputted by the output buffer B2 is supplied to the output pad OT1 as shown in FIG. 3 through the common output line TL and the output line QL.

Next, only the switch element SW3 among the switch elements SW1 to SWn turns on and the rest of the switch elements are all off, and thus, the output data signal DD3 outputted by the output buffer B3 is outputted from the output pad OT1 as shown in FIG. 3 through the common output line TL and the output line QL.

Similarly thereafter, the output data signals DD4 to DDn outputted by the output buffers B4 to Bn are outputted sequentially from the output pad OT1 through the common output line TL and the output line QL.

Thus, as shown in FIG. 2, with the probe needle 30 remaining in contact with the output pad OT1 among the output pads OT1 to OTn, the LSI tester 20 can acquire the output state of each of the output buffers B1 to Bn by time division through the probe needle 30.

Figure 4:
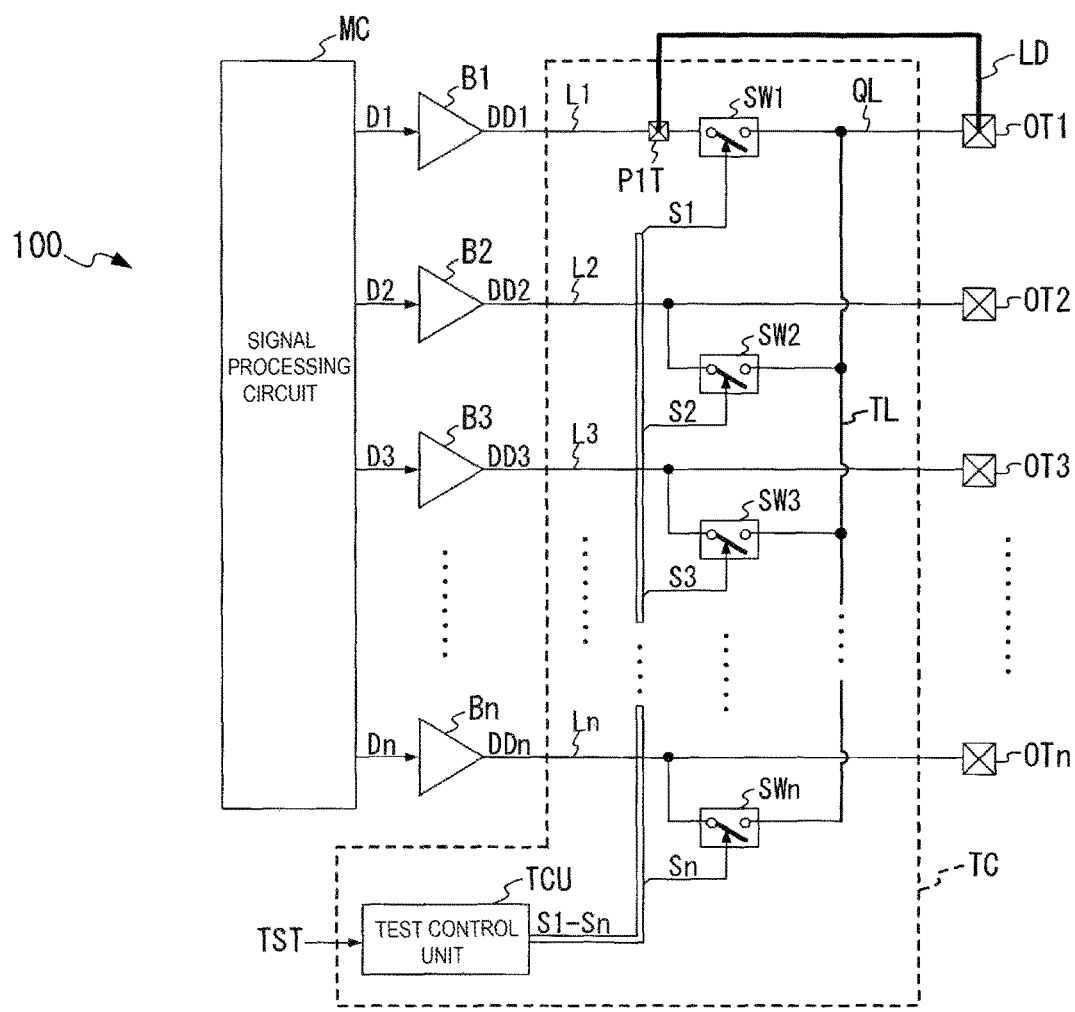
FIG. 4 is a schematic view of a semiconductor device 100 on which a wiring process has been performed to connect a shorting pad P1T to an output pad OT1 through a metal wiring line LD.

Once the test is finished and the semiconductor chip 10 is determined not to be defective, then, as shown in FIG. 4, a wiring process is performed on the semiconductor chip 10 in which the shorting pad P1T and the output pad OT1 are connected to each other through the metal wiring line LD, made of copper, gold, an alloy thereof, or the like. In this manner, in the semiconductor device 100, both ends of the switch element SW1 are shorted by the metal wiring line LD. Thus, after the wiring process is completed, the output data signal DD1 outputted from the output buffer B1 does not pass through the switch element SW1, but is rather supplied directly to the output pad OT1 through the metal wiring line LD.

In this manner, in the semiconductor chip 10, during testing a plurality of output signals (DD1 to DDn) can be acquired by time division from one output pad (OT1) among the existing output pads (OT1 to OTn). Thus, with the semiconductor chip 10, it is possible to reduce the size of the device compared to a configuration providing specialized test pads for outputting a plurality of output signals (DD1 to DDn) by time division, that is, test pads having a surface area allowing for contact by a probe needle.

Also, in a semiconductor chip 10 that has been shipped, the output data signal (DD1) outputted from the output buffer (B1) does not pass through the switch element (SW1), which is provided for testing, but is rather supplied directly to the output pad (OT1) through the metal wiring line (LD). Thus, it is possible to mitigate degradation in output characteristics.

Embodiment 2

Figure 5:
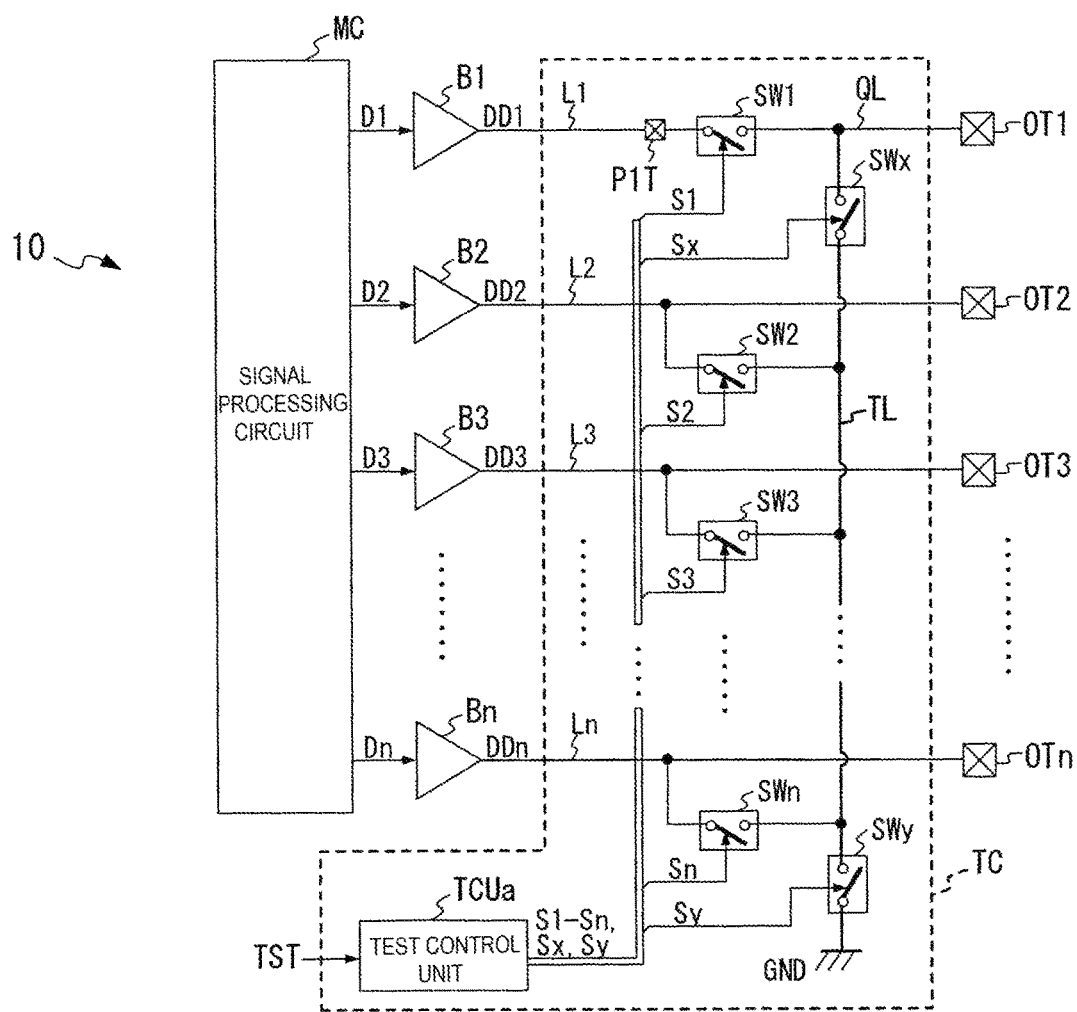
FIG. 5 is a circuit diagram showing a circuit according to Embodiment 2 formed in a semiconductor chip 10 after manufacturing.

FIG. 5 is a circuit diagram showing a circuit according to Embodiment 2 formed in a semiconductor chip 10 after manufacturing. The configuration shown in FIG. 5 is similar to that of FIG. 1 except that a testing control unit TCUa is used instead of the testing control unit TCU shown in FIG. 1, a switch element SWx is additionally provided as a common output switch, and a switch element SWy is additionally provided as a grounding switch.

The switch element SWx configured to be set on or off according to a switching signal Sx. When the switch element SWx is set to be on, the output line QL and the common output line TL are connected. On the other hand, when the switch element SWx is set to be off, the output line QL is disconnected from the common output line TL. It is preferable that the switch element SWx be formed in the vicinity of the output line QL.

The switch element SWy is configured to be set on or off according to a switching signal Sy. In this case, when the switch element SWy is set to be on, a ground potential GND is applied to the common output line TL. On the other hand, when the switch element SWy is set to be off, application of the ground potential GND to the common output line TL is stopped.

Figure 6:
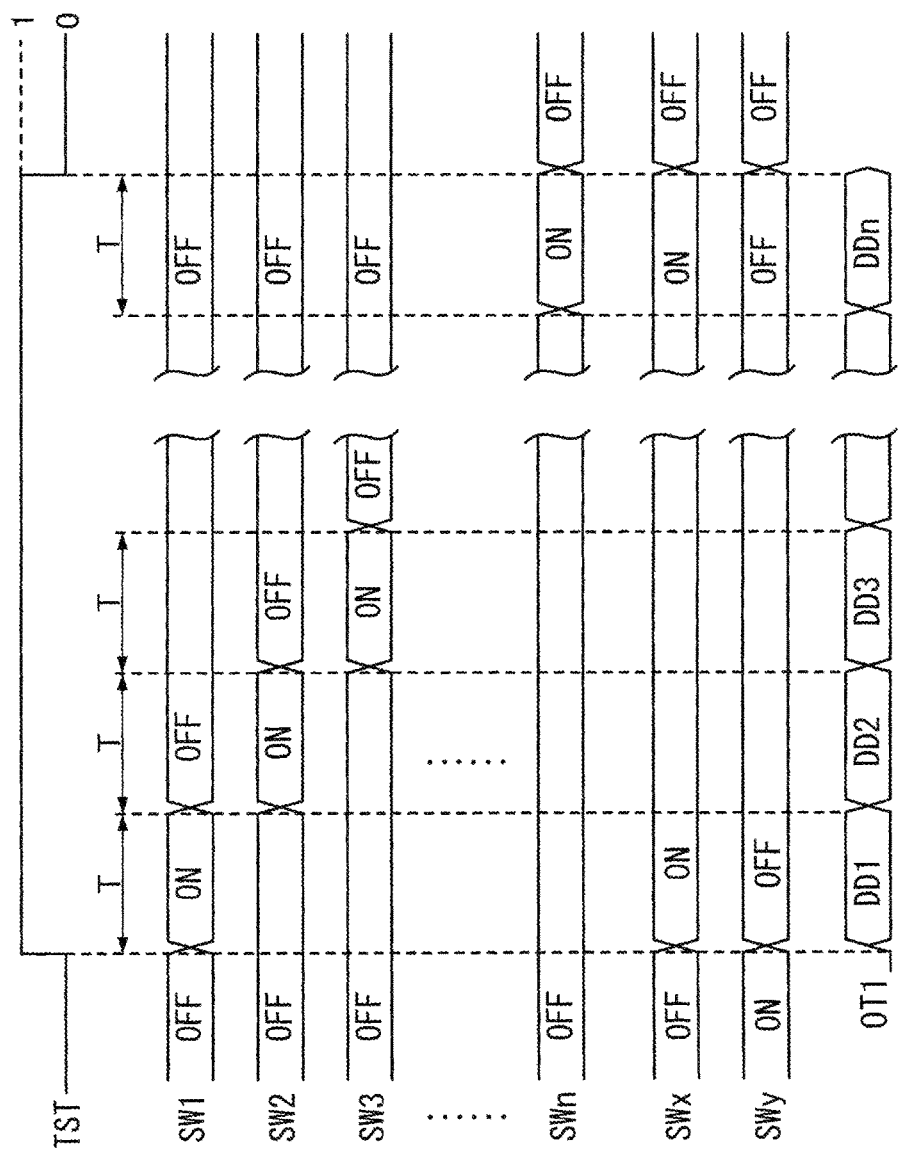
FIG. 6 is a time chart showing an example of operations performed in a testing circuit TC of the semiconductor chip 10 shown in FIG. 5 according to a test signal TST.

Even when the configuration shown in FIG. 5 is adopted for the testing circuit TC of the semiconductor chip 10, testing is performed according to the system configuration shown in FIG. 2 in a manner similar to the configuration shown in FIG. 1. In this case, the test operation for when the configuration shown in FIG. 5 is adopted for the semiconductor chip 10 is similar to that of the configuration shown in FIG. 1. In other words, similar to the testing control unit TCU shown in FIG. 1, when the test signal TST switches from a logic level of 0 to a logic level of 1, the testing control unit TCUa supplies to the control terminal of the switch elements SW1 to SWn the switching signals S1 to Sn that sequentially and alternately set the switch elements SW1 to SWn on, as shown in FIG. 6. In this manner, as shown in FIG. 6, the output data signals DD1 to DDn outputted by the output buffers B1 to Bn are outputted sequentially from the output pad OT1 through the common output line TL and the output line QL.

However, as shown in FIG. 6, in the testing control unit TCUa, when the test signal TST is at a logic level of 0, that is, during normal mode, the testing control unit TCUa supplies to the control terminal of the switch element SWx the switching signal Sx that sets the switch element SWx off. In this manner, the switch element SWx is set to be off, and the output line QL is disconnected from the common output line TL. Thus, among the output line QL and the lines L2 to Ln connected, respectively, to the output pads OT1 to OTn, the common output line TL to which only the output line QL is connected is electrically disconnected from the output line QL. In other words, during normal mode, the wiring capacitance of the common output line TL is removed from the output line QL, and the wiring capacitance of the output paths (L1 to Ln, QL) corresponding to the output pads OT1 to OTn becomes uniform. In this manner, it is possible to make uniform the output characteristics of the signals outputted, respectively, from the output pads OT1 to OTn.

Furthermore, while the test signal TST remains at a logic level of 0 indicating normal mode, as shown in FIG. 6, the testing control unit TCUa supplies to the control terminal of the switch element SWy the switching signal Sy to set the switch element SWy on. In this manner, the switch element SWy is set to be on, and the ground potential GND is applied to the common output line TL. In other words, during normal mode, the common output line TL, which is unneeded at this time, is fixed at the ground potential GND, thereby reducing noise generated by the common output line TL.

Once the test is finished and the semiconductor chip 10 is determined not to be defective, then, similar to the semiconductor chip 10 having the configuration shown in FIG. 1, a wiring process is performed on the semiconductor chip 10 in which the shorting pad P1T and the output pad OT1 are connected to each other through the metal wiring line LD, as shown in FIG. 4.

Thus, in a semiconductor chip 10 that has been shipped, the output data signal DD1 outputted from the output buffer B1 does not pass through the switch element SW1, which is provided for testing, but is rather supplied directly to the output pad OT1 through the metal wiring line LD. Therefore, it is possible to mitigate degradation of output characteristics.

Embodiment 3

Figure 7:
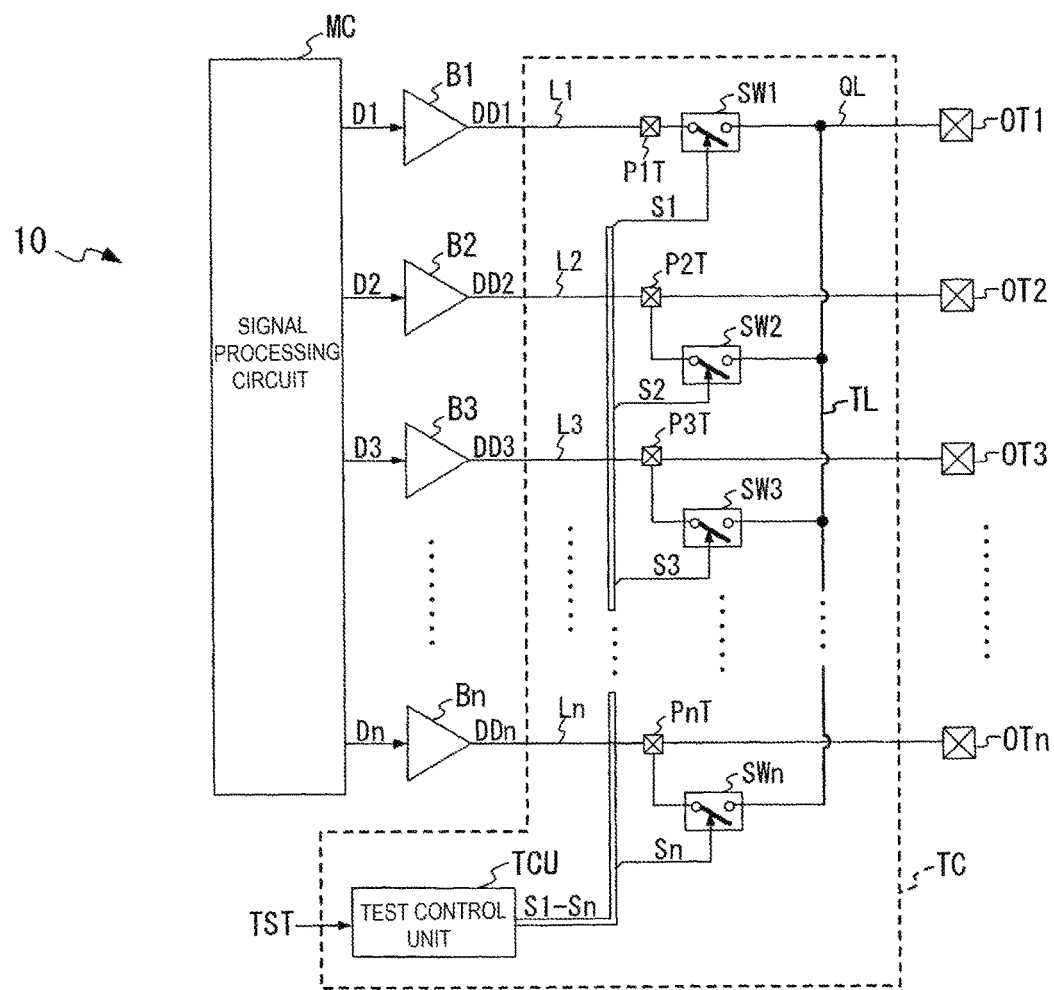
FIG. 7 is a circuit diagram showing a circuit according to Embodiment 3 formed in a semiconductor chip 10 after manufacturing.

FIG. 7 is a circuit diagram showing a circuit according to Embodiment 3 formed in a semiconductor chip 10 after manufacturing. The configuration shown in FIG. 7 is the same as that of FIG. 1 except that shorting pads P2T to PnT for connecting the shorting wiring line are each formed in the lines L2 to Ln. In this case, it is preferable that the shorting pads P2T to PnT be disposed in a position such that the length of the line L(t) from the output terminal of the output buffer B(t) (t being an integer of 2 to n) to the shorting pad P(t)T is equal to the length of the line L1 from the output terminal of the output buffer B1 to the shorting pad P1T.

Even when the configuration shown in FIG. 7 is adopted for the testing circuit TC, testing of the semiconductor chip 10 is performed according to the system configuration shown in FIG. 2 in a manner similar to the configuration shown in FIG. 1. In this case, the test operation for when the configuration shown in FIG. 7 is adopted for the semiconductor chip 10 is similar to that of the configuration shown in FIG. 1.

Figure 8:
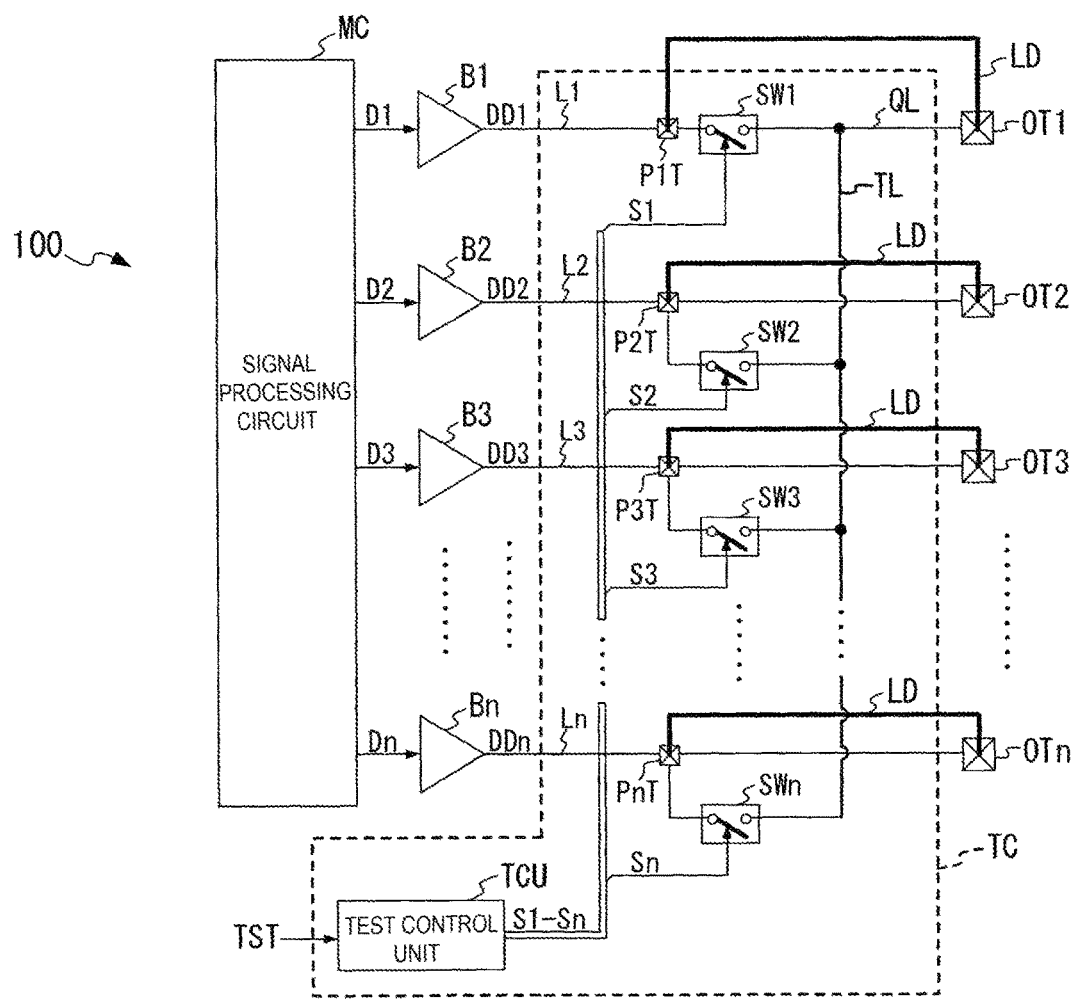
FIG. 8 is a schematic view of a semiconductor device 100 on which a wiring process has been performed to connect shorting pads (P1T to PnT) and output pads (OT1 to OTn), shown in FIG. 7, through a metal wiring line LD.

Once the test is finished and the semiconductor chip 10 is determined not to be defective, then as shown in FIG. 8, a wiring process is performed on the semiconductor chip 10 in which the shorting pad P1T and the output pad OT1 are connected to each other through the metal wiring line LD, and furthermore, the shorting pads P(t) (t being an integer of 2 to n) are connected to the output pads OT(t) through the metal wiring lines LD. In this manner, metal wiring lines LD are also present in the output paths from the output buffers B(t) to the output pads OT(t), similar to the output path from the output buffer B1 to the output pad OT1.

Thus, according to the configuration shown in FIG. 8, the wiring material of the respective output paths (lines L, metal wiring lines LD) is the same, allowing for a uniform strength for all the signals outputted from the output pads OT1 to OTn.

Embodiment 4

Figure 9:
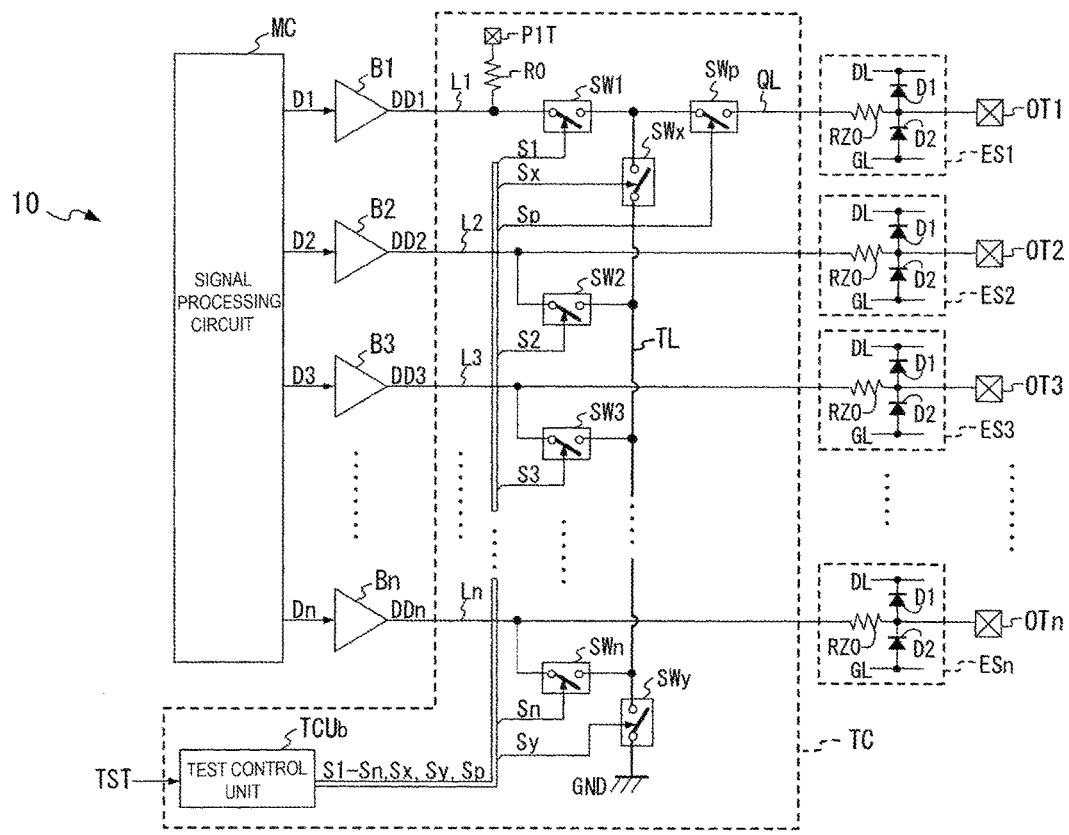
FIG. 9 is a circuit diagram showing a circuit according to Embodiment 4 formed in a semiconductor chip 10 after manufacturing.

FIG. 9 is a circuit diagram showing a circuit according to Embodiment 4 formed in a semiconductor chip 10 after manufacturing. The configuration shown in FIG. 9 is the same as that of FIG. 5 except that a testing control unit TCUb is used instead of the testing control unit TCUa, and a resistor R0 and a switch element SWp as an output switch are additionally provided.

The configuration shown in FIG. 9 takes into account electrostatic discharge (ESD) protection circuits ES1 to ESn (omitted in FIGS. 1, 4, 5, 7, and 8) formed in the vicinity of the output pads OT1 to OTn, respectively.

The ESD protection circuits ES1 to ESn have the same circuit configuration, and each are constituted of an output resistor RZ0 and diodes D1 and D2. In the ESD protection circuit ES1, for example, the anode terminal of the diode D1 and the cathode terminal of the diode D2 are connected to the output pad OT1. The cathode terminal of the diode D1 is connected to a power source line DL, and the anode terminal of the diode D2 is connected to a grounding line GL. Furthermore, in the ESD protection circuit ES1, one end of the output resistor RZ0 is connected to the output pad OT1, and the other end is connected to the output line QL. The output resistor RZ0 provided in each ESD protection circuit ES1 to ESn performs the role of reducing the amount of current flowing into the output buffer (B1 to Bn) through the output pad (OT1 to OTn) as a result of electrostatic discharge. The output resistor RZ0 has the additional role of performing impedance matching with an external device connected to the output pads (OT1 to OTn).

However, when, after manufacturing of the semiconductor chip 10, the path between the shorting pad P1T and the output pad OT1 is shorted by the metal wiring line LD, current no longer flows in the output resistor RZ0, which results in the output resistor RZ0 no longer exhibiting the above-mentioned effects.

Therefore, the testing circuit TC shown in FIG. 9 is provided with a resistor R0 having the same resistance as the output resistor RZ0. One end of the resistor R0 is connected to the line L1 and the other end is connected to the shorting pad P1T. Additionally, in the testing circuit TC shown in FIG. 9, the switch element SWp is provided between the output line QL, and a node at which the other end of the switch element SW1 is connected to one end of the switch element SWx. The switch element SWp is configured to be set on or off according to a switching signal Sp. When the switch element SWp is set to be on, the node and the output line QL are electrically connected, and when the switch element SWp is set to be off, the node and the output line QL are disconnected from each other.

Even when the configuration shown in FIG. 9 is adopted for the testing circuit TC of the semiconductor chip 10, testing is performed according to the aspect shown in FIG. 2 in a manner similar to the configuration shown in FIG. 5. In this case, the test operation for when the configuration shown in FIG. 9 is adopted is similar to that of the configuration shown in FIG. 5. In other words, similar to the testing control unit TCUa, when the test signal TST switches from a logic level of 0 to a logic level of 1, the testing control unit TCUb supplies to the control terminal of the switch elements SW1 to SWn the switching signals S1 to Sn that sequentially and alternately set the switch elements SW1 to SWn on, as shown in FIG. 10.

Figure 10:
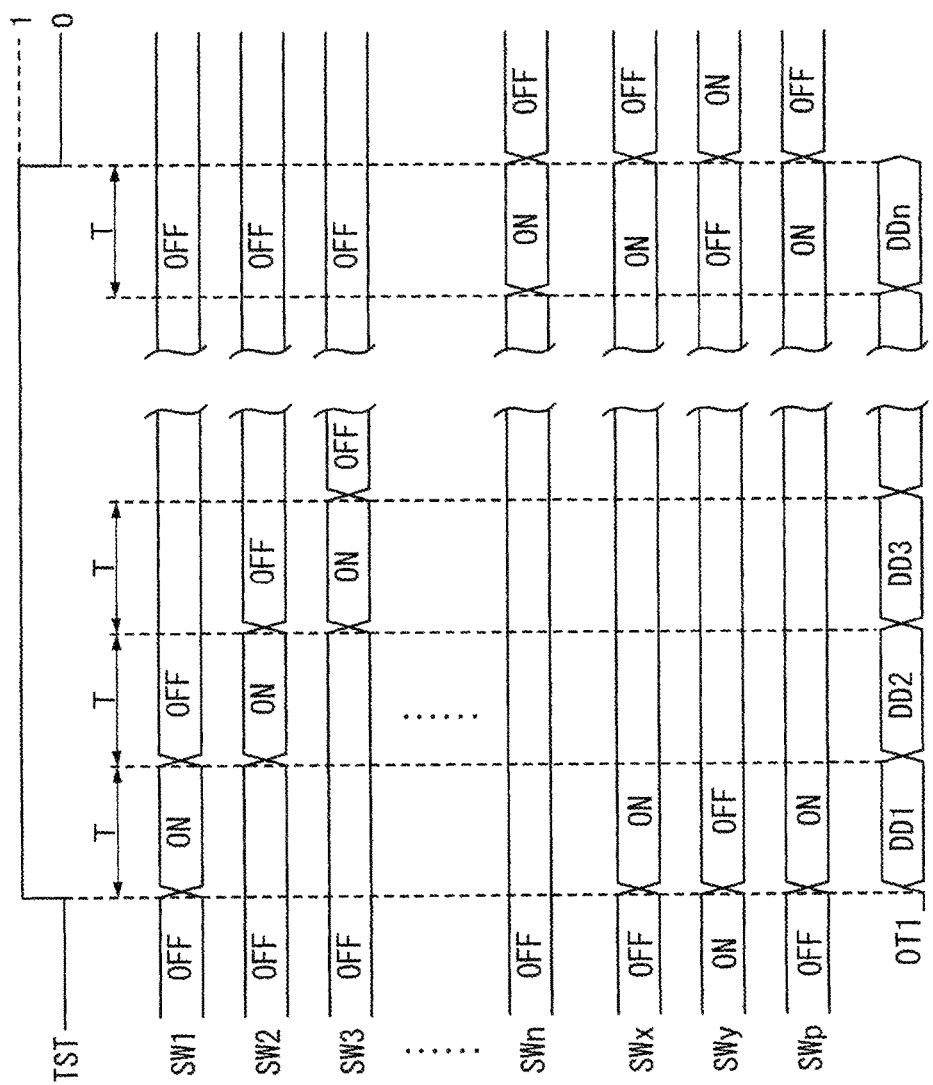
FIG. 10 is a time chart showing an example of operations performed in a testing circuit TC of the semiconductor chip 10 shown in FIG. 9 according to a test signal TST.

Also, while the test signal TST remains at a logic level of 1, as shown in FIG. 10, the testing control unit TCUb supplies to the control terminal of the switch elements SWx and SWp the switching signals Sx and Sp to set the switch elements SWx and SWp on. Furthermore, while the test signal TST remains at a logic level of 1, as shown in FIG. 10, the testing control unit TCUb supplies to the control terminal of the switch element SWy the switching signal Sy to set the switch element SWy off.

In this manner, while the test signal TST is at a logic level of 1, as shown in FIG. 10, the output data signals DD1 to DDn outputted by the output buffers B1 to Bn are outputted from the output pad OT1 through the common output line TL, the switch element SWx, the switch element SWp, and the output line QL.

On the other hand, while the test signal TST remains at a logic level of 0, or in other words, during normal mode, as shown in FIG. 10, the testing control unit TCUb supplies to the control terminal of the switch elements SWx and SWp the switching signals Sx and Sp to set the switch elements SWx and SWp off. Furthermore, the testing control unit TCUb supplies to the control terminal of the switch element SWy the switching signal Sy to set the switch element SWy on.

In this manner, the switch element SWx disconnects the common output line TL from the output line QL. Thus, among the output line QL and the lines L2 to Ln connected, respectively, to the output pads OT1 to OTn, the common output line TL to which only the output line QL is connected is electrically disconnected from the output line QL. In other words, during normal mode, the wiring capacitance of the common output line TL is removed from the output line QL, and thus, the wiring capacitance of the output paths (L1 to Ln, QL) corresponding to the output pads OT1 to OTn becomes uniform. In this manner, it is possible to make uniform the output characteristics of the signals outputted, respectively, from the output pads OT1 to OTn.

Furthermore, during normal mode indicated by the test signal TST having a logic level of 0, the common output line TL, which is unneeded at this time, is fixed at ground potential GND, enabling reduction in noise.

Figure 11:
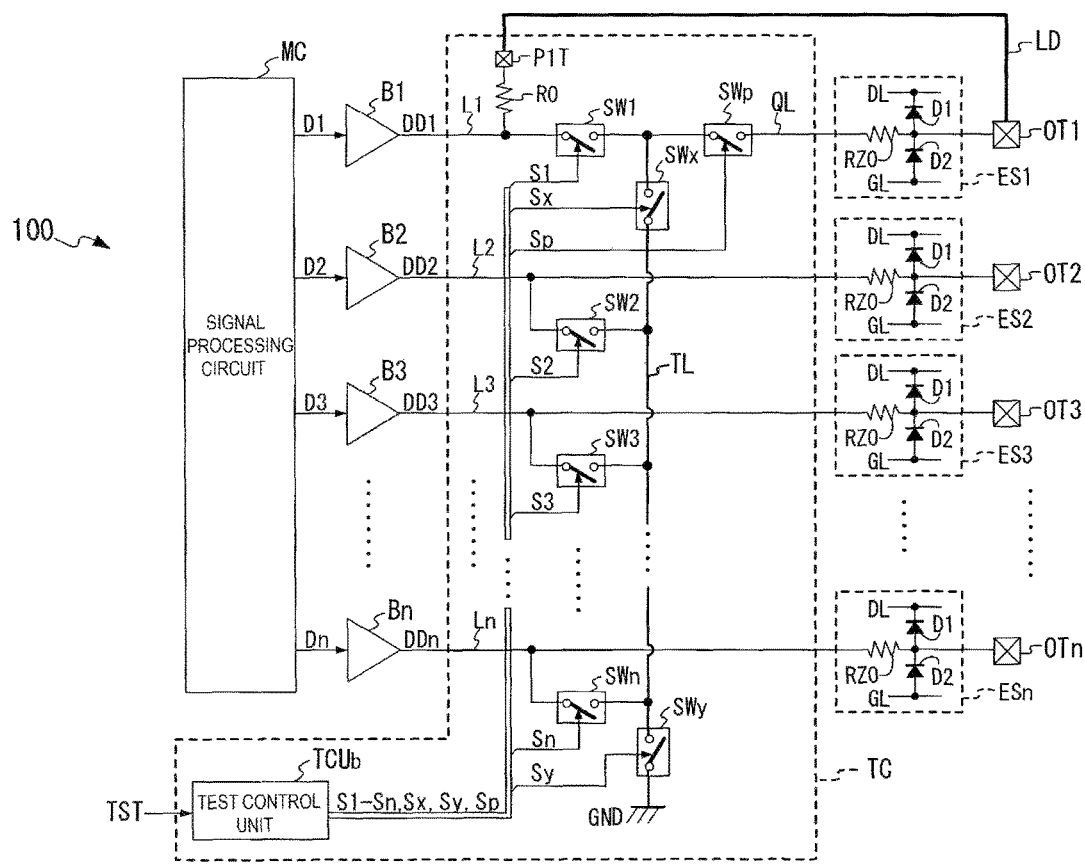
FIG. 11 is a schematic view of a semiconductor device 100 on which a wiring process has been performed to connect a shorting pad P1T and an output pad OT1, shown in FIG. 9, through a metal wiring line LD.

Once the test is finished and the semiconductor chip 10 is determined not to be defective, then, as shown in FIG. 11, a wiring process is performed on the semiconductor chip 10 in which the shorting pad P1T and the output pad OT1 are connected to each other through the metal wiring line LD.

Thus, in the semiconductor chip 10 in which the wiring process has been performed, the output data signal DD1 outputted from the output buffer B1 is supplied to the output pad OT1 through the line L1, the resistor R0, and the metal wiring line LD. In the semiconductor chip 10 on which the wiring process was performed, the resistor R0 instead of the output resistor RZ0 provided in the ESD protection circuit ES1 serves as a resistor to suppress current resulting from electrostatic discharge that flows in through the output pad OT1 as well as perform impedance matching with an external device. If a resistor R0 with a configuration enabling a change in resistance is used, it is possible to make adjustments to mitigate load variation resulting from the layout by adjusting the resistance of the resistor R0 during testing. Also, it is possible to adjust the resistance of the resistor R0 during testing to a value optimal for the testing operation, and thus, it is possible to facilitate debugging and reduce testing time.

In the circuit diagrams shown in FIGS. 1, 4, 5, 9, and 11, the shorting pad P1T and the output pad OT1 are positioned apart from each other with the switch element SW1 therebetween. In the circuit diagrams shown in FIGS. 7 and 8, the shorting pads P1T to PnT and the output pads OT1 to OTn corresponding thereto are positioned apart from each other with the switch elements SW1 to SWn therebetween.

However, in the actual layout of the semiconductor chip 10, the shorting pad P1T and the output pad OT1, and connected pairs of the shorting pads P1T to PnT and output pads OT1 to OTn are formed in the same bump mounting regions, respectively.

Figure 12:
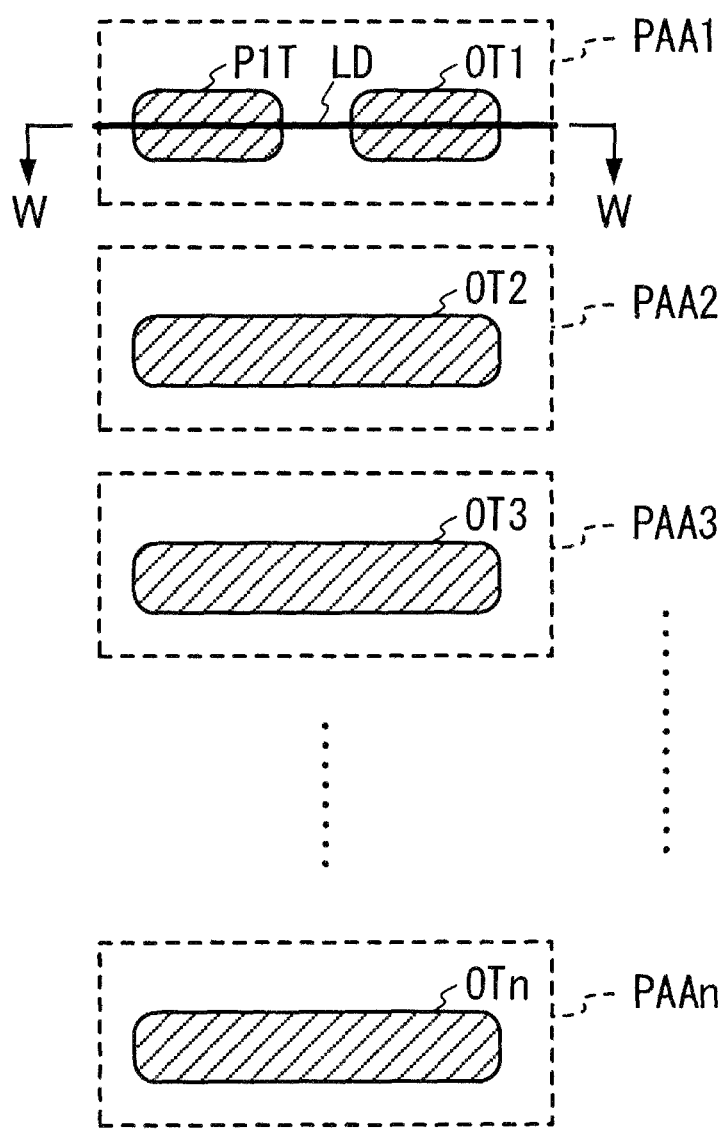
FIG. 12 is a front view showing an example of a layout in the semiconductor chip of the shorting pad P1T and the output pads OT1 to OTn formed in the semiconductor chips 10 shown in FIGS. 1, 4, 5, 9, and 11.

In the semiconductor chips 10 having the configuration of FIGS. 1, 4, 5, 9, and 11, for example, the output pads OT2 to OTn are formed, respectively, in pad regions PAA2 to PAAn having the same size, as shown in FIG. 12. However, the pad region PAA1 has formed therein the shorting pad P1T and the output pad OT1. In other words, the one output pad is split into two parts, one of which is the shorting pad P1T and the other of which is the output pad OT1, and both parts are formed in the same pad region PAA1. At this time, when shipping the semiconductor chip 10, as shown in FIG. 12, the shorting pad P1T and the output pad OT1 are connected to each other through the metal wiring line LD.

Figure 13:
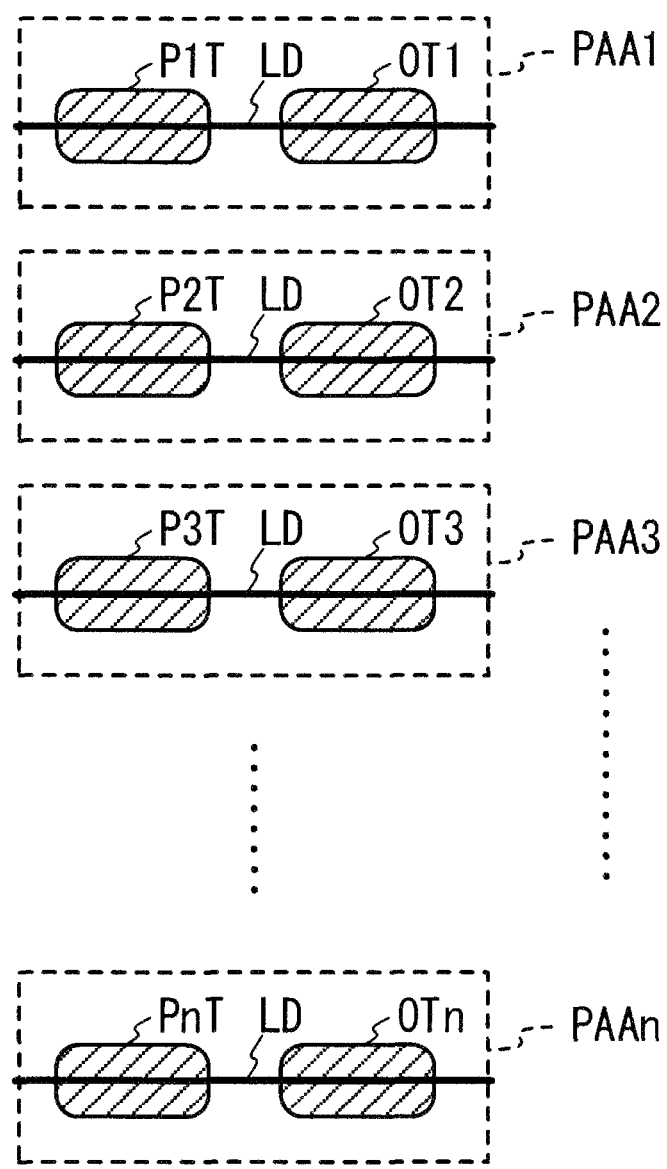
FIG. 13 is a front view showing an example of a layout in the semiconductor chip of the shorting pad P1T and the output pads OT1 to OTn formed in the semiconductor chips 10 shown in FIGS. 7 and 8.

Also, as shown in FIG. 13, in the semiconductor chip 10 having the configuration of FIGS. 7 and 8, for example, connected pairs of the output pads and shorting pads are formed, respectively, in the pad regions PAA1 to PAAn. At this time, when shipping the semiconductor chip 10, as shown in FIG. 13, the shorting pads and the output pads are connected to each other through the metal wiring lines LD in the pad regions PAA1 to PAAn, respectively.

As described above, the semiconductor chip 10 shown in FIG. 1, 5, or 7 has a first line, a signal processing circuit, a first output pad, an output line, a first switch, and a first shorting pad such as described below, and the first output pad and the first shorting pad are formed in the same bump region (PAA1). The signal processing circuit (MC) transmits a first output signal (DD1) generated by performing a signal process to the first line (L1). The first line is connected to the first shorting pad (P1T) and the first output pad (OT1) is connected to the output line (QL). When the first switch (SW1) is on, the first line and the output line are connected to each other, and when the first switch is off, the first line and the output line are disconnected from each other.

In addition to the first line, the signal processing circuit, the shorting pad, the first switch, the first output pad, and the output line, the semiconductor chip 10 shown in FIG. 9 includes a first output resistor, an output switch, and a first resistor, and the first output pad and the shorting pad are formed in the same bump region (PAA1). The signal processing circuit (MC) transmits a first output signal (DD1) generated by performing a signal process to the first line (L1). One end of the first resistor (R0) is connected to the first line and the other end of the first resistor is connected to the shorting pad (P1T). Also, one end of the first switch (SW1) is connected to the first line. One end of the first output resistor (RZ0) is connected to the first output pad (OT1), and the other end of the first output resistor is connected to the output line (QL). Furthermore, one end of the output switch (SWp) is connected to the output line and the other end of the output switch is connected to the other end of the first switch.

After manufacturing the semiconductor chip 10, the shorting pad and the output pad formed in the semiconductor chip 10 are connected to each other through the metal wiring line LD, thereby readying the semiconductor device for shipment.

Figure 14:
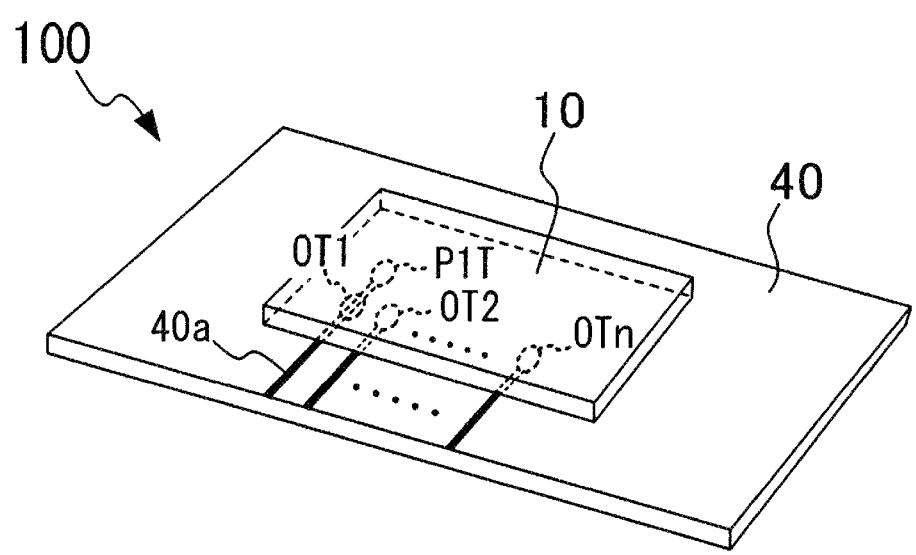
FIG. 14 is an external view showing a semiconductor device 100 according to a COF mounting aspect in which the shorting pad and the output pads formed in the semiconductor chip 10 are connected using wiring in a film circuit substrate 40.

When shipping the semiconductor chip 10 of a chip on film (COF) mounting aspect in which the semiconductor chip 10 is mounted on a film circuit substrate, for example, wiring lines formed in the film circuit substrate may be used as the metal wiring lines LD connecting the shorting pads with the output pads. In a semiconductor device 100 in which the semiconductor chip 10 is mounted on a film circuit substrate 40 as shown in FIG. 14, for example, each of the output pads OT1 to OTn of the semiconductor chip 10 is connected to one end of each individual wiring line 40a formed on the surface of the film circuit substrate 40, and the other end of each wiring line 40a is disposed on the edge of the film circuit substrate 40. Here, the one end of the wiring line 40a connected to the output pad OT1 is connected not only to the output pad OT1 but also to the shorting pad P1T.

Also, when connecting the shorting pad P1T to the output pad OT1, a wire bonding process after manufacturing of the semiconductor chip 10 may be performed to connect the shorting pad P1T to the output pad OT1 through the metal wiring line LD as a bonding wire.

Figure 15:
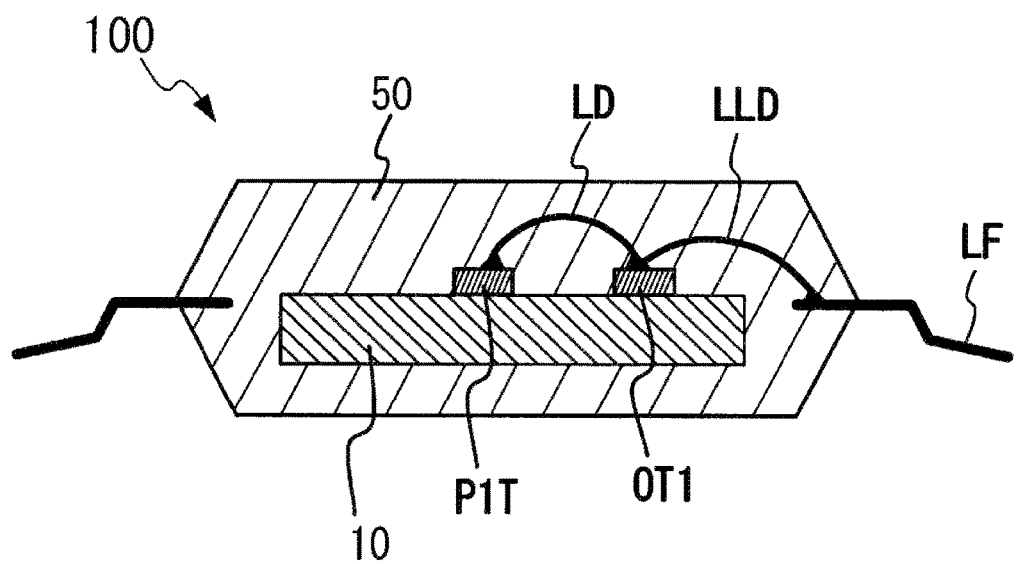
FIG. 15 is a cross-sectional view of a semiconductor device 100 in which the shorting pad and the output pad formed in the semiconductor chip 10 are connected by wire bonding.

FIG. 15 is a cross-sectional view along the line W-W shown in FIG. 12 of the semiconductor device 100 manufactured by such a wire bonding process. In the semiconductor device 100 shown in FIG. 15, the shorting pad P1T and the output pad OT1 of the semiconductor chip 10 are connected through the metal wiring line LD as the bonding wire by the wire bonding process, and the output pad OT1 and an inner lead LF are connected through a metal wiring line LLD as a bonding wire. Additionally, in the semiconductor device 100 shown in FIG. 15, a portion of the inner lead LF, that is, the end region including the connecting portion where the metal wiring line LLD is connected, the semiconductor chip 10, and the metal wiring lines LD and LLD are sealed in a mold resin 50 made of an epoxy resin or the like, for example.

Also, if a wafer level chip size package (wafer level chip scale package) (WLCSP) is used as the package of the semiconductor chip 10, for example, then the shorting pad and the output pad may be connected to each other during a rewiring process performed after manufacturing the WLCSP.

Figure 16:
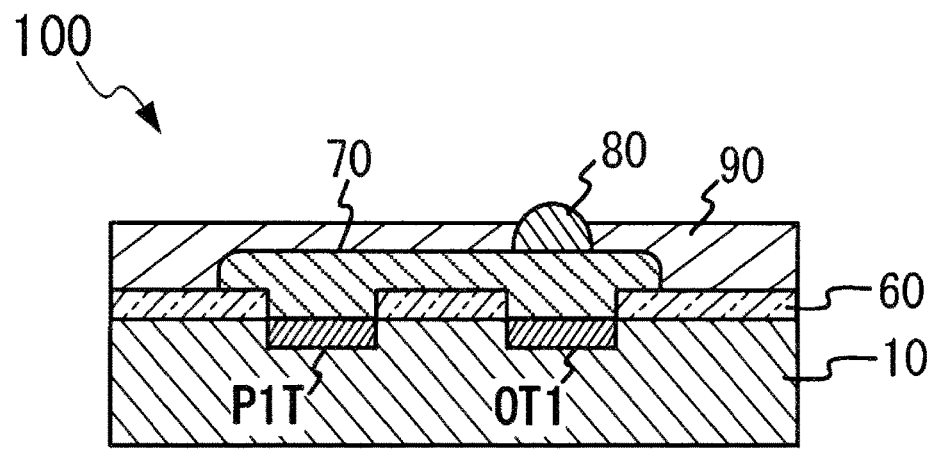
FIG. 16 is a cross-sectional view of a WLCSP aspect of a semiconductor device 100 in which the shorting pad and the output pad formed in the semiconductor chip 10 are connected by a rewiring layer 70.

FIG. 16 is a cross-sectional view along the line W-W shown in FIG. 12 of the semiconductor device 100 manufactured by packaging the semiconductor chip 10 in a WLCSP.

That is, in a WLCSP, a passivation layer 60 is formed on the surface of the semiconductor chip 10 excluding where the respective pads (PIT to PnT, OT1 to OTn, etc.) are formed after testing is completed. A rewiring layer 70 made of aluminum or the like is formed so as to cover a portion of the surface of the passivation layer 60 and the surfaces of the shorting pad P1T and the output pad OT1, for example. The rewiring layer 70 electrically connects the shorting pad P1T to the output pad OT1 as the metal wiring line LS. The surface of the rewiring layer 70 has formed thereon a semispherical solder bump 80 that conducts the output data signal DD1 supplied to the output pad OT1 to outside of the package. Additionally, the surfaces of the passivation layer 60 and the rewiring layer 70 are sealed by a mold resin 90 with the exception of the surface region of a portion of the bump 80.

The semiconductor devices 100 shown in FIGS. 4 and 8 have a semiconductor chip (10) having the configuration described below and the first wiring line (LD). That is, the semiconductor chip has the first line, the signal processing circuit, the first output pad, the output line, the first switch, and the first shorting pad. The signal processing circuit (MC) transmits a first output signal (DD1) generated by performing a signal process to the first line (L1). Also, the output line (QL) is connected to the first output pad (OT1), and when the first switch (SW1) is on, the first line and the output line are connected to each other, and when the first switch is off, the first line and the output line are disconnected from each other. The first shorting pad (P1T) is connected to the first line. Additionally, the semiconductor devices shown in FIGS. 4 and 8 are provided with the first wiring line (LD), which connects the first shorting pad (P1T) and the first output pad (OT1) formed on the semiconductor chip.

The semiconductor device 100 shown in FIG. 11 has the following: the semiconductor chip 100, which includes the first line, the signal processing circuit, the shorting pad, the first switch, the first output pad, and the output line as well as a first output resistor, an output switch, and a first resistor; and the first wiring line (LD). That is, the signal processing circuit (MC) transmits a first output signal (DD1) generated by performing a signal process to the first line (L1). One end of the first resistor (R0) is connected to the first line and the other end of the first resistor is connected to the shorting pad (P1T). Also, one end of the first switch (SW1) is connected to the first line. One end of the first output resistor (RZ0) is connected to the first output pad (OT1), and the other end of the first output resistor is connected to the output line (QL). Furthermore, one end of the output switch (SWp) is connected to the output line and the other end of the output switch is connected to the other end of the first switch. Additionally, the semiconductor device shown in FIG. 11 is provided with the first wiring line (LD), which connects the above-mentioned shorting pad (P1T) and the first output pad (OT1) formed on the semiconductor chip.

What is claimed is:

1. A semiconductor chip having a test mode and a normal mode, comprising:
    a signal processing circuit configured to generate first to nth output signals, n being an integer of 2 or greater;
    first to nth output pads;
    first to nth output lines respectively connecting the signal processing circuit to the first to nth output pads, the first to nth output signals from the signal processing circuit respectively being output from the first to nth output pads through the first to nth output lines in the normal mode;
    a shorting pad formed in the first output line;
    a common output line, one end of the common output line being connected to the first output line;
    first to nth switches,
        the first switch being connected between the shorting pad and the common output line,
        each of the second to nth switches
            respectively being connected between a corresponding one of the second to nth output lines and the common output line, and
            being configured to connect the signal processing circuit to the common output line and disconnect the signal processing circuit from the common output line according to when said each switch is turned on and off, respectively; and
    a testing control unit configured
        to receive a test signal indicating either the test mode or the normal mode,
        when the test signal indicates the test mode, to control the first to nth switches selectively and alternately to be turned on, and
        when the test signal indicates the normal mode, to control all of the first to nth switches to be turned off.

2. The semiconductor chip according to claim 1, further comprising:
    a common output switch formed in the common output line; and
    a grounding switch connected between another end of the common output line and a ground potential, wherein
    the testing control unit is further configured,
        when the test signal indicates the test mode, to control the common output switch to be turned on and the grounding switch to be turned off, and
        when the test signal indicates the normal mode, to control the common output switch to be turned off and the grounding switch to be turned on.

3. A semiconductor device, comprising:
    the semiconductor chip according to claim 2; and
    a wiring line connecting the shorting pad to the first output pad.

4. The semiconductor device according to claim 3, further comprising a film circuit substrate on which the semiconductor chip is mounted,
    wherein the first wiring line is formed in the film circuit substrate.

5. The semiconductor device according to claim 3, wherein the first wiring line is a bonding wire.

6. The semiconductor device according to claim 3, wherein
    the semiconductor device is a wafer level chip size package (WLCSP) including the semiconductor chip, and
    the first wiring line is a rewiring layer in the WLCSP.

7. The semiconductor device according to claim 3, wherein the shorting pad is a first shorting pad,
    the semiconductor device, further comprising
    second to nth shorting pads respectively formed in the second to nth output lines.

8. The semiconductor device according to claim 7, wherein
    the wiring line is a first wiring line,
    the semiconductor device, further comprising second to nth wiring lines respectively connecting the second to nth shorting pads to the second to nth output pads.

9. The semiconductor device according to claim 7, further comprising:
    first to nth resistors respectively connected between the first to nth output lines, and the first to nth shorting pads; and
    first to nth output resistors connected between the first to nth output lines, and the first to nth output pads, a resistance of each of the first to nth resistors being equal to a resistance of a corresponding one of the first to nth output resistors, respectively.

10. The semiconductor device according to claim 3, further comprising:
    a first resistor connected between the first output line and the shorting pad; and
    a first output resistor connected between the first output line and the first output pad.

11. The semiconductor device according to claim 10, wherein a resistance of the first resistor is equal to a resistance of the first output resistor.

12. The semiconductor chip according to claim 1, wherein the shorting pad is a first shorting pad,
    the semiconductor chip, further comprising second to nth shorting pads respectively formed in the second to nth output lines.

13. The semiconductor chip according to claim 1, further comprising:
    a first resistor connected between the first output line and the shorting pad; and
    a first output resistor connected between the first output line and the first output pad.

14. The semiconductor chip according to claim 13, wherein a resistance of the first resistor is equal to a resistance of the first output resistor.

* * * * *